United States Patent [19]

Park

[11] Patent Number: 5,701,105

[45] Date of Patent: Dec. 23, 1997

[54] TIMER OSCILLATION CIRCUIT WITH COMPARATOR CLOCK CONTROL SIGNAL SYNCHRONIZED WITH OSCILLATION SIGNAL

[75] Inventor: Soung Hwi Park, Kyungsangbook-Do, Rep. of Korea

[73] Assignee: LG Semicon Co., Ltd., Cheongju, Rep. of Korea

[21] Appl. No.: 791,575

[22] Filed: Jan. 31, 1997

Related U.S. Application Data

[63] Continuation of Ser. No. 511,272, Aug. 4, 1995, abandoned.

[51] Int. Cl.$^6$ .................................................. H03K 3/023
[52] U.S. Cl. .................. 331/153; 331/143; 331/111; 331/177 R; 327/141; 327/144; 327/135; 326/96
[58] Field of Search .......................... 327/141, 142, 327/72, 74, 76, 175, 144, 63, 64, 71, 73; 331/153, 143, 111, 177 R; 326/93, 96

[56] References Cited

U.S. PATENT DOCUMENTS

| | | | |
|---|---|---|---|
| 3,745,367 | 7/1973 | Schindler et al. | 327/141 X |
| 4,017,747 | 4/1977 | Sheng | 327/76 |
| 4,590,444 | 5/1986 | Wilcox | 331/111 |
| 5,302,869 | 4/1994 | Hosotani et al. | 327/74 X |
| 5,481,161 | 1/1996 | El-hamamsy et al. | 315/224 |
| 5,565,819 | 10/1996 | Cooper | 331/111 |

*Primary Examiner*—Robert Pascal
*Assistant Examiner*—Arnold Kinkead
*Attorney, Agent, or Firm*—Fleshner & Kim

[57] ABSTRACT

An improved timer oscillation circuit capable of synchronizing an oscillation frequency, which is determined by a time constant of a resistance and a capacitance, to a clock signal, which includes a first voltage comparator, controlled by a clock signal, for charging a first voltage on a second capacitance and for outputting a result obtained by comparing the charged voltage on the second capacitance and a voltage from the first capacitance; and a second voltage comparator, controlled by the clock signal, for charging a voltage outputted from the first capacitance on a third capacitance and for outputting a result by comparing the charged voltage and an electric potential of the second voltage, so that it can be advantageously adopted to a digital circuit by outputting an oscillation signal having a cycle determined by a time constant of a resistance and a capacitance and which is synchronized to a clock signal.

4 Claims, 4 Drawing Sheets

FIG. 3
CONVENTIONAL ART
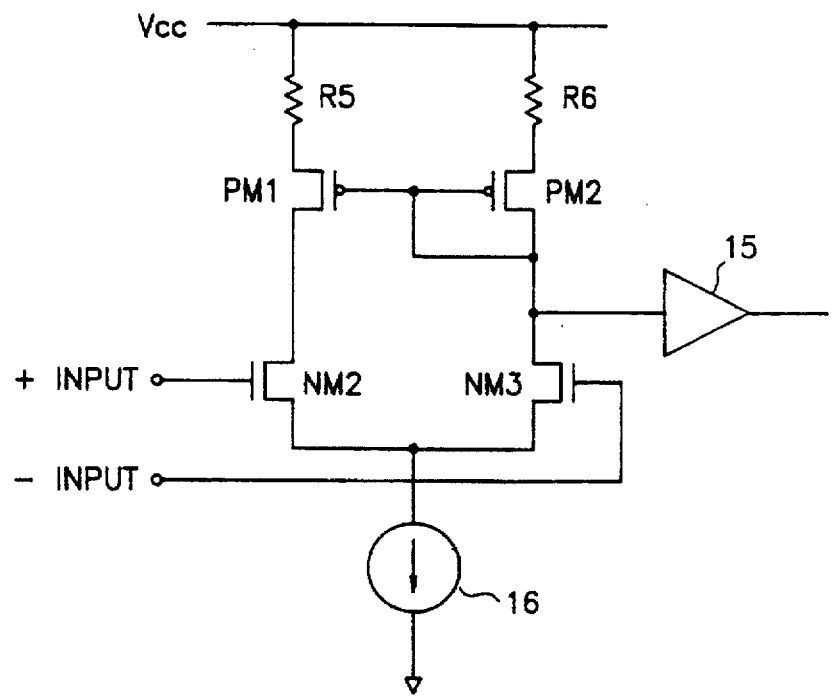
FIG. 4A
CONVENTIONAL ART
FIG. 4B
CONVENTIONAL ART
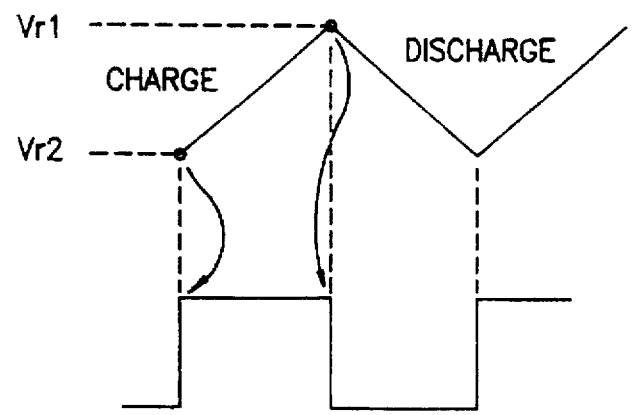

FIG.6B

INTEGER TIMES
OF CK CYCLE

TIMER OSCILLATION CIRCUIT WITH COMPARATOR CLOCK CONTROL SIGNAL SYNCHRONIZED WITH OSCILLATION SIGNAL

This application is a continuation of application Ser. No. 08/511,272 filed Aug. 4, 1995 now abandoned.

BACKGROUND OF THE INVENTION

1. Field of the Invention

The present invention relates to a timer oscillation circuit, and in particular to an improved timer oscillation circuit capable of synchronizing an oscillation frequency, which is determined by a time constant of a resistance and a capacitance, to a clock signal.

2. Description of the Conventional Art

Referring to FIG. 1, conventionally a resistance R1 and a capacitance C1 are connected in series between the output terminal of a timer oscillator 10 and ground, and a signal taken from a point A between the resistance R1 and the capacitance C1 is concurrently applied to a threshold voltage Th input terminal of a trigger voltage Tr input terminal, and an oscillation operation is performed by the timer oscillator 10 in accordance with a time constant of the resistance R1 and the capacitance C1.

Referring to FIG. 2, the conventional timer oscillator 10 includes a voltage divider 11 for dividing an externally supplied voltage Vcc into a certain ratio using resistances R2 through R4, a first voltage comparator 12 for comparing the divided voltage Vr1 of the divider 11 and the threshold voltage Th, a second voltage comparator 13 for comparing the divided voltage Vr2 of the divider 11 and the trigger voltage Tr, an SR latch 14 for latching the output signals of the first and second voltage comparators 12 and 13, and an NMOS transistor NM1 when the inverted output signal/Q of the SR latch 14 is a high level.

Referring to FIG. 3, the voltage comparators 12 and 13 each include PMOS transistors PM1 and PM2, having theirs sources connected to the external supply voltage Vcc through respective resistances R5 and R6 for forming a current mirror, an NMOS transistor NM2 having its drain connected to the drain of the PMOS transistor PM1, its source connected to a static current source 16, and its gate receiving a positive input signal, and an NMOS transistor NM3 having its drain connected to the drain of the PMOS transistor PM2 and to the gates of the PMOS transistors PM1 and PM2, and its gate receiving a negative input signal, and the drain of the PMOS transistor PM2 being connected to the input terminal of an output amplifier 15.

The operation of the conventional timer oscillation circuit will now be explained.

When a reset signal of a low level is inputted to the invertor IN1, the invertor IN1 inverts the reset signal RST of a low level to a high level and applies the inverted reset signal RST to an input of the NOR gate NR1. Therefore, the NOR gate NR1 outputs a signal of a low signal irrespective of the state of its other input signals. The output signal of the NOR gate NR1 of a low level is inverted by the invertors IN2 and IN3. The output signal Q of the timer oscillator 10 becomes low level. The threshold voltage Th and the trigger voltage Tr outputted at the point A between the resistance R1 and the capacitance C1 become a low level, respectively. The voltages Vr1 and Vr2 obtained by dividing the external supply voltage Vcc in a certain ratio by the divider 11 are inputted to the inverting input terminal (−) of the voltage comparator 12 and the non-inverting input terminal (+) of the voltage comparator, respectively. In addition, the threshold voltage Th and the trigger voltage Tr of a low level are respectively inputted to the other input terminals of the comparators 12 and 13. Therefore, the voltage comparators 12 and 13 output a low level signal and a high level signal, respectively. In addition, the NOR gate NR2, to which the output signal S of the voltage comparator 13 of a high level is applied, outputs a low level signal. The output signal of the NOR gate NR2 of a low level and the output signal R of the voltage comparator 12 of a low level are applied to the NOR gate NR1, respectively. At this time, a reset signal RST of a high level is applied to the invertor IN1, and the invertor I1 inverts the high level of the signal to a low level, and the NOR gate NR1 outputs a high level signal. Since the output signal of the NOR gate NR1 of a high level is outputted through the invertors IN2 and IN3 in order, and since the output signal Q of the timer oscillator 10 of a high level is charged into the capacitance C1 through the resistance R1, the voltage level at the point A increases.

As the voltage at the point A continuously increases, when the level of the threshold voltage Th applied to the comparator 12 becomes higher than that of the voltage Vr1 divided by the divider 11, the voltage comparator 12 outputs a signal of a high level, and the NOR gate NR1 outputs a signal of a low level. In addition, the output signal of a low level from the NOR gate NR1 is outputted through the invertors IN2 and IN3 in order, and the signal Q of a low level is outputted from the timer oscillator 10. When the output signal of the timer oscillator 10 becomes a low level, the potential of the capacitance C1 is discharged by the resistance R1, and the discharging voltage level drops.

If the voltage on the capacitance C1 which is outputted from the crossing point A drops below that of the voltage Vr2 divided by the divider 11, the voltage comparator 13 to which the voltage Vr2 and the trigger voltage Tr of the point A are inputted outputs a signal of a high level. Therefore, since the NOR gate NR2 outputs a signal of a low level, and the NOR gate NR1 outputs a signal of a high level. The output signal of a high level from the NOR gate NR1 is outputted through the invertors IN2 and IN3 in order, and the signal of a high level is outputted from the timer oscillator 10. When the output signal Q of the timer oscillator 10 becomes a high level, the potential of the capacitance C1 is discharged through the resistance R1, so the discharging level is increased. That is, if the voltage level from the point A becomes higher than that of the voltage Vr1, the timer oscillator 10 outputs a signal of a low level, and if the level of the voltage outputted from the crossing point A becomes lower than that of the voltage Vr2, the timer oscillator 10 outputs a signal of a high level. As the above described operation is repeatedly performed, the oscillation operation is performed. The timer oscillation circuit outputs an oscillating signal with a wave form shown in FIG. 4, and the oscillation frequency is determined by a time constant of the resistance R1 and the capacitance C1.

However, the conventional timer oscillation circuit has disadvantages in that its construction is relatively complicated because a differential amplifier is adopted thereto as a voltage comparator, and the power consumption is excessive because a static current source is adopted. In addition, because the oscillating frequency is subjected to the resistance and the capacitance the conventional timer oscillation circuit can easily be damaged by voltage variation and the temperature. Moreover, it is difficult to synchronize a corresponding element in a digital circuit.

SUMMARY OF THE INVENTION

Accordingly, it is an object of the present invention to provide a timer oscillation circuit, which overcome the problems encountered in the conventional timer oscillation circuit.

It is another object of the present invention to provide an improved timer oscillation circuit capable of synchronizing an oscillation frequency, which is determined by a time constant of a resistance and a capacitance, to a clock signal.

To achieve the above objects, there is provided a timer oscillation circuit, which includes a first voltage comparator, controlled by a clock signal, for charging a first voltage on a second capacitance and for outputting a result obtained by comparing the charged voltage on the second capacitance and a voltage from the first capacitance; and a second voltage comparator, controlled by the clock signal, for charging a voltage outputted from the first capacitance on a third capacitance and for outputting a result by comparing the charged voltage and an electric potential of the second voltage.

BRIEF DESCRIPTION OF THE DRAWINGS

FIG. 3 is a schematic circuit diagram of a voltage comparator of FIG. 2.

FIGS. 4A and 4B illustrate wave forms of an input voltage and an output signal respectively of a conventional timer oscillation circuit of a timer oscillator.

FIGS. 6A through 6C illustrate wave forms of internal voltage and an output signal respectively a timer oscillation circuit of a timer oscillator according to the present invention.

DETAILED DESCRIPTION OF THE INVENTION

To begin with, because the construction of a divider 11, an SR latch 14, and an NMOS transistor NM1 utilized herein are the same as the constructions previously described in connection with the conventional art, further description thereof will be omitted.

Figure 1:
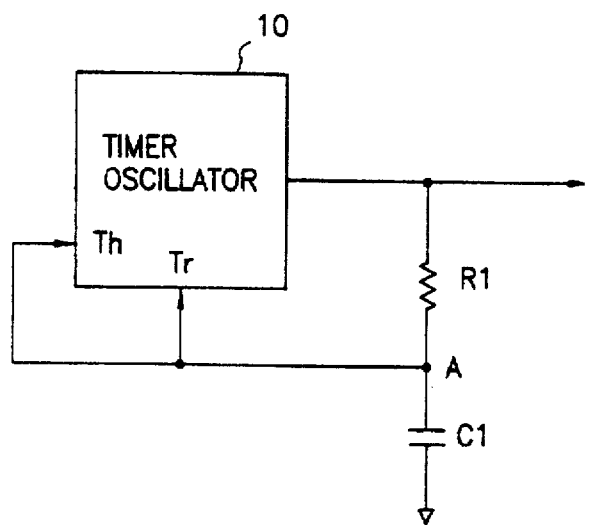
FIG. 1 is a block diagram of a conventional timer oscillation circuit of a timer oscillator.
Figure 2:
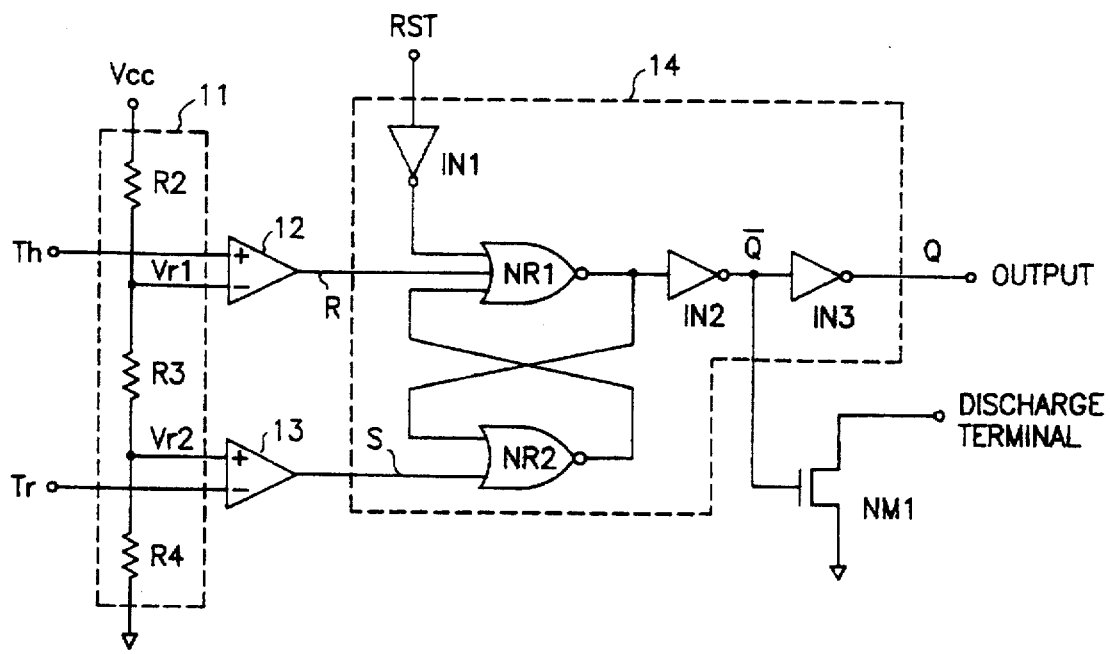
FIG. 2 is a schematic circuit of a conventional timer oscillator.
Figure 5:
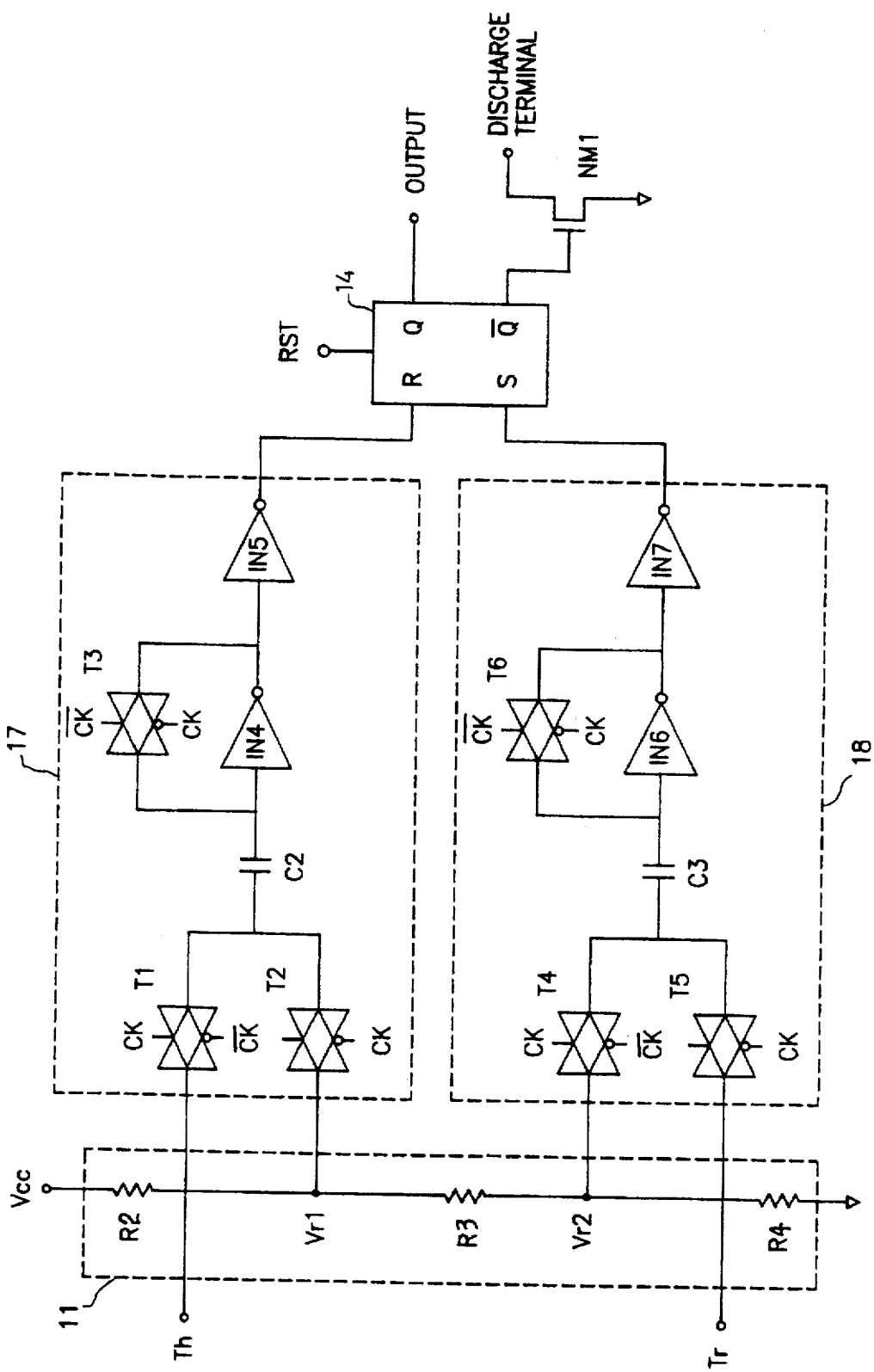
FIG. 5 is a schematic circuit diagram of a timer oscillation circuit according to the present invention.

Referring to FIG. 5, a timer oscillation circuit according to the present invention includes the voltage comparators 17 and 18, of which the voltage comparator 17 includes a transmission gate T1 for transmitting a threshold voltage Th in accordance a clock signal CK and an inverted clock signal /CK applied to a positive control terminal and a negative control terminal, respectively, thereof a transmission gate T2 for transmitting the voltage Vr1 divided by the divider 11 in accordance with a clock signal CK and an inverted clock signal /CK applied to a negative control terminal and a positive control terminal, respectively, thereof a capacitance C2 which is discharged as the output signals of the transmission gates T1 and T2 are applied thereto, an invertor IN4 for inverting the voltage on the capacitance C2, a transmission gate T3 for transmitting the signal applied to the input terminal of the invertor 4 to the output terminal in accordance with a clock signal CK and an inverted clock signal /CK applied to a positive control terminal and a negative control terminal, respectively, and thereof an invertor IN5 for inverting the signals outputted from the commonly connected invertor IN4 and transmission gate T3.

In addition, the voltage comparator 18 includes the same construction as the voltage comparator 17, except that a voltage Vr2 divided by the divider 11 is inputted to the input terminal of a transmission gate T4, and a trigger voltage Tr is inputted to the input terminal of a transmission gate T5.

The operation of the timer oscillation circuit according to the present invention will now be explained.

To begin with, when the reset signal RST of a low level is applied to the SR latch 14, the SR latch 14 outputs a signal of a low level, and the output signal Q of the timer oscillator 10 becomes a low level. Therefore, since the charging level of the capacitance C1 becomes a low level, the threshold voltage Th and the trigger voltage Tr which are respectively inputted to the comparators 17 and 18 become low level, respectively. The threshold voltage Th and the trigger voltage Tr are inputted to the transmission gates T1 and T5 of the voltage comparators 17 and 18, respectively, and the voltages Vr1 and Vr2 divided by the divider 11 are inputted to the transmission gates T2 and T4, respectively, and when the clock signal CK is a high level, the threshold voltage Th and the voltage Vr2 are charged into the capacitances C2 and C3, respectively. Therefore, the voltage comparators 17 and 18 output a low level signal and a high level signal, respectively. Since the signal S of a high level outputted from the voltage comparator 18 is applied to the NOR gate NR2 of SR latch 14, the NOR gate NR2 outputs a signal of a low level. At this time, when the reset signal RST of a high level is applied, the reset signal is inverted into a low level signal by the invertor IN1 and is applied to the NOR gate NR1. Thereafter, as the NOR gate NR1 receives the output signal of a low level of the invertor IN1, the output signal of the voltage comparator 17, and the output signal of the NOR gate NR2, the NOR gate NR1 outputs a signal of a high level. The above described signal of a high level is outputted through the invertors IN2 and IN3, and the SR latch 14 outputs a signal Q of a high level.

As described above, as the signal of a high level outputted from the SR latch 14 is charged into the capacitance C1 through the resistance R1, the charging level increases, and the threshold voltage Th increases relative to the voltage Vr1 divided by the divider 11 in accordance with the charging level of the capacitance C1. The voltage comparator 17 performs a comparison operation in accordance with externally applied clock signals CK and /CK, and at this time, when the clock signal CK is a low level, the transmission gate T1 is turned off, and the transmission gate T2 is turned on, and the voltage comparator 17 transmits the voltage Vr1 to the capacitance C2. Therefore, as the capacitance C2 is charged by the voltage Vr1, and as the transmission gate T3 is turned on, so that the invertor IN4 outputs an interim level signal which is between a high level and a low level.

At this time, when the clock signal CK become a high level, the transmission gates T2 and T3 are turned off, respectively, and the threshold voltage Th which the transmission gate T1 transmits is applied to the capacitance C2. Here, when the level of the threshold voltage Th is higher than the voltage level of the capacitance C2 charged by the voltage Vr1, the charging level of the capacitance C2 increases, and the increased electric potential is inverted into a low level by the invertor IN4 and is inverted into a high level again by the invertor IN5. However, when the level of the threshold voltage Th is lower than the voltage level of the capacitance C2 charged by the voltage Vr1, the charging level of the capacitance C2 drops, and the dropped electric potential is inverted into a high level by the invertor IN4 and is inverted into a low level by the invertor IN5.

However, since the level of the threshold voltage Th outputted from the point A is higher than that of the voltage Vr1, the voltage comparator 17 outputs a signal R of a high level, and the NOR gate NR1 of the SR latch 14 outputs a signal of a low level. Since the output signal of a low level of the NOR gate NR1 is inverted by the invertors IN2 and IN3, respectively, when the output signal Q of the SR latch 14 becomes a low level, the electric potential of the capacitance C1 is discharged by the resistance R1, and its charging level drops.

At this time, when the voltage at the point A drops below the voltage Vr2 due to the discharging of the capacitance C1, the voltage comparator 18 perform a voltage comparison operation by means of the clock signals CK and /CK. That is, when the eternally applied clock signal CK is a high level, the transmission gate T4 is turned on, and the transmission gates T5 and T6 are turned off, respectively, and the voltage Vr2 is charged into the capacitance C3 through the transmission gate T4. Thereafter, since the electric potential of the charged capacitance C3 is inverted by the invertors IN6 and IN7 in order, the voltage comparator 18 outputs a signal S of a high level to the SR latch 14.

Therefore, in the SR latch 14, the NOR gate NR2 outputs a low level signal, and the NOR gate NR1 outputs a high level signal because all of its three input signals are low level, and the output signal of a high level is inverted by the invertors IN2 and IN3. Therefore, the SR latch 14 outputs a signal of a high level, and the capacitance C1 is charged.

Figure 6A:
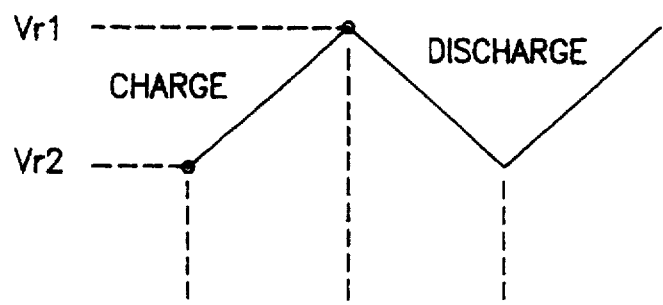
Figure 6C:
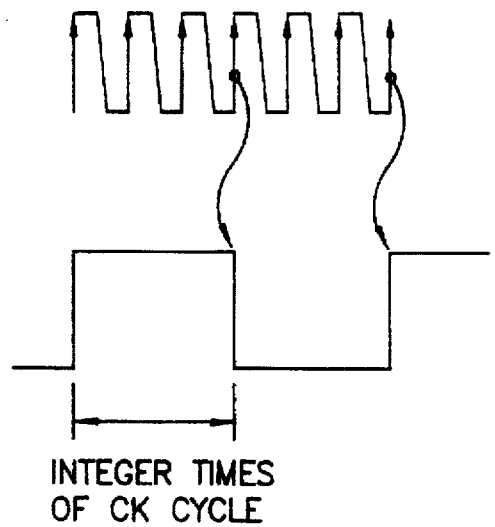

Accordingly, as the voltage comparators 17 and 18 perform a comparison operation by means of the clock signals CK and /CK, the SR latch 14 repeatedly outputs signals of a high level and a low level, and as shown in FIG. 6, the SR latch 14 outputs a signal having an oscillation wave form having a certain cycle determined by a time constant of the resistance R1 and the capacitance C1 and synchronized to the clock signal CK. As shown in FIGS. 6A through 6C, the cycle of an oscillation is synchronized to the clock signal CK, and the range of the output signal of a high level and a low level has a certain integer times.

As described above, the timer oscillation circuit has advantages in that it can be advantageously adopted to a digital circuit by outputting an oscillation signal having a cycle determined by a time constant of a resistance and a capacitance and which is synchronized to a clock signal. That is, the oscillation signal synchronized to the clock signal in the digital circuit has the effect of dividing the clock signal into a certain ratio, which can be determined by the time constant of the resistance and the capacitance. In addition, the construction of the timer oscillation circuit according to the present invention is simple, and its power consumption is not excessive.

What is claimed is:

1. A timer oscillation circuit, wherein first and second voltage comparison means which compare a first voltage and a second voltage obtained by dividing an external voltage into a certain ratio with a voltage of a first capacitance which is charged and discharged in accordance with a signal outputted from a timer oscillator and wherein a set-reset latch means outputs an oscillating signal in accordance with an output signal of said first and second comparison means inputted thereto, comprising:

first voltage comparison means, controlled by a clock signal, for charging a first charged voltage on a second capacitance and for outputting a result obtained by comparing the first charged voltage on said second capacitance and the voltage from said first capacitance; and second voltage comparison means, controlled by said clock signal, for charging a second charged voltage outputted from the first capacitance on a third capacitance and for outputting a result by comparing the second charged voltage and an electric potential of said second voltage wherein said oscillating signal is synchronized to said clock signal.

2. The circuit of claim 1, wherein said first voltage comparison means includes:

a first transmission gate for transmitting an applied threshold voltage in accordance with a clock signal and an inverted clock signal applied to a positive control terminal and a negative control terminal, respectively, thereof;

a second transmission gate for transmitting said first voltage in accordance with a clock signal and an inverted clock signal applied to a negative control terminal and a positive control terminal, respectively, thereof;

the second capacitance charged or discharged in accordance with output signals of said first transmission gate and said second transmission gate;

a third transmission gate for transmitting a signal applied to an input terminal of a first invertor in accordance with a clock signal and an inverted clock signal applied to a negative and positive control terminal; and a second invertor for inverting a signal outputted from output terminals of said commonly connected first invertor and third transmission gate.

3. The circuit of claim 1, wherein said second voltage comparison means includes:

a first transmission gate for transmitting a second voltage as a clock signal and an inverted clock signal are applied to a positive control terminal and a negative control terminal, respectively;

a second transmission gate for transmitting a trigger voltage as a clock signal and an inverted clock signal are applied to a negative control terminal and a positive control terminal, respectively;

the third capacitance which is charged or discharged in accordance with output signals of said first transmission gate and said second transmission gate which are applied thereto;

a first invertor for inverting the output signal of said third capacitance;

a third transmission gate for transmitting the signal applied to the input terminal of the first invertor to the output terminal of the first invertor as a clock signal and an inverted clock signal are applied to a negative control terminal and a positive control terminal, respectively; and a second invertor for inverting signals outputted from output terminals of commonly connected first invertor and third transmission gate.

4. A timer oscillation circuit, wherein first and second voltage comparison means compare a first reference voltage and a second reference voltage obtained by dividing an externally input voltage into a certain ratio with a voltage of a first capacitor which is charged and discharged in accordance with a signal outputted from a latch in accordance with output signals of said first and second voltage comparison means, the improvement comprising:

said first voltage comparison means being controlled by a first clock signal and a second clock signal, complementary to the first clock signal, charging a first reference voltage on a second capacitor, and outputting a result obtained by comparing the charged voltage on said second capacitor and a voltage from said first capacitor, wherein said first voltage comparison means further includes:

a first transmission gate for transmitting the voltage of said first capacitor in accordance with a clock signal and an inverted clock signal applied to a positive control terminal and a negative control terminal thereof, respectively;

a second transmission gate for transmitting said first reference voltage in accordance with the clock signal and the inverted clock signal applied to a negative control terminal and a positive control terminal thereof, respectively;

a second capacitor being charged or discharged in accordance with the output signals of said first transmission gate and said second transmission gate;

a third transmission gate for transmitting a voltage charged on the second capacitor in accordance with the clock signal and the inverted clock signal applied to a negative and a positive control terminal thereof, respectively; and a first inverter connected in parallel with the third transmission gate, for inverting the voltage charged on the second capacitor, and said second voltage comparison means, being controlled by said first and second clock signals, charging the voltage outputted from the first capacitor on a third capacitor, and outputting a result obtained by comparing the charged voltage on said third capacitor and an electric potential of said second reference voltage, wherein said second voltage comparison means further includes:

a fourth transmission gate for transmitting said second reference voltage in accordance with the clock signal and the inverted clock signal applied to a positive control terminal and a negative control terminal thereof, respectively;

a fifth transmission gate for transmitting the voltage of said first capacitor in accordance with the clock signal and the inverted clock signal applied to a negative control terminal and a positive control terminal thereof, respectively;

a third capacitor being charged or discharged in accordance with the output signals of said fourth transmission gate and said fifth transmission gate;

a sixth transmission gate for transmitting a voltage charged on the third capacitor in accordance with the clock signal and the inverted clock signal applied to a negative and a positive control terminal thereof, respectively; and a second inverter connected in parallel with the sixth transmission gate, for inverting the voltage charged on the third capacitor.

* * * * *